(12) United States Patent
Tarleton et al.

(10) Patent No.: US 11,196,430 B2
(45) Date of Patent: Dec. 7, 2021

(54) HIGH-BANDWIDTH PHASE LOCK LOOP CIRCUIT WITH SIDEBAND REJECTION

(71) Applicant: Honeywell International Inc., Morris Plains, NJ (US)

(72) Inventors: Norman Gerard Tarleton, Glendale, AZ (US); Chuck Croker, Glendale, AZ (US); Lee K. Strandjord, Tonka Bay, MN (US)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 16/795,365

(22) Filed: Feb. 19, 2020

(65) Prior Publication Data

US 2021/0254977 A1 Aug. 19, 2021

(51) Int. Cl.
*H03L 7/10* (2006.01)
*G01C 19/72* (2006.01)
(Continued)

(52) U.S. Cl.
CPC ............ *H03L 7/103* (2013.01); *G01C 19/727* (2013.01); *H03L 7/093* (2013.01); *H03L 7/0994* (2013.01)

(58) Field of Classification Search
CPC ........ H03L 7/103; H03L 7/093; H03L 7/0994
See application file for complete search history.

(56) References Cited

U.S. PATENT DOCUMENTS

| | | |
|---|---|---|
| 4,000,476 A | 12/1976 | Walker et al. |
| 4,077,016 A | 2/1978 | Sanders et al. |

(Continued)

FOREIGN PATENT DOCUMENTS

| | | |
|---|---|---|
| CN | 1630197 A | 6/2005 |
| DE | 10062347 A1 | 6/2002 |

(Continued)

OTHER PUBLICATIONS

Leonov et al., "Hold-in, pull-in, and lock-in ranges of PLL circuits: rigorous mathematical definitions and limitations of classical theory.", IEEE Transactions on Circuits and Systems-I: Regular Papers, Sep. 25, 2016, pp. 1-12, IEEE.

(Continued)

*Primary Examiner* — Sibin Chen
(74) *Attorney, Agent, or Firm* — Fogg & Powers LLC

(57) ABSTRACT

In one embodiment, a phase lock loop circuit includes a control circuit, wherein the control circuit is configured to input an estimation having a second frequency and a second phase. The second frequency is selected from a range of frequencies including a first frequency from an acquired signal. A numerically controlled oscillator is coupled to the control circuit, wherein the control circuit is configured to control an output response of the numerically controlled oscillator. The numerically controlled oscillator is configured to receive the estimation from the control circuit and generate an output signal in response to the estimation. A phase detector is coupled to the control circuit and the numerically controlled oscillator, wherein the phase detector is configured to compare the first signal and the output signal and produce a comparison output, the comparison output indicative of a phase difference between the first signal and the estimation.

21 Claims, 5 Drawing Sheets

(51) Int. Cl.
*H03L 7/093* (2006.01)
*H03L 7/099* (2006.01)

(56) References Cited

U.S. PATENT DOCUMENTS

| | | | |
|---|---|---|---|
| 4,423,390 | A | 12/1983 | Waters |
| 5,053,724 | A | 10/1991 | Ogino et al. |
| 2005/0084052 | A1* | 4/2005 | Paille .................. H03L 7/113 375/376 |
| 2016/0164531 | A1* | 6/2016 | Dionne .................. H03L 7/081 331/25 |
| 2016/0334217 | A1 | 11/2016 | Strandjord et al. |
| 2018/0128613 | A1* | 5/2018 | Jandak ............... G01C 19/5691 |
| 2020/0025568 | A1 | 1/2020 | Strandjord et al. |

FOREIGN PATENT DOCUMENTS

| | | |
|---|---|---|
| DE | 102004020156 A1 | 12/2004 |
| EP | 3598069 A1 | 1/2020 |
| JP | 2000183734 A | 6/2000 |

OTHER PUBLICATIONS

Ye et al., "Direct loop gain and bandwidth measurement of phase-locked loop", Review of Scientific Instruments 88, Aug. 23, 2017, pp. 1-6, AIP Publishing.
European Patent Office, "Extended European Search Report from EP Application No. 20211382.5", from Foreign Counterpart to U.S. Appl. No. 16/795,365, filed May 12, 2021, pp. 1 through 10, Published: EP.

* cited by examiner

HIGH-BANDWIDTH PHASE LOCK LOOP CIRCUIT WITH SIDEBAND REJECTION

U.S. GOVERNMENT LICENSE RIGHTS

This invention was made with Government support under Ordnance Technology Base Agreement No. 2016-316 and Ordnance Agreement No. 1, awarded by the Department of Defense Ordnance Technology Consortium. The Government has certain rights in the invention.

BACKGROUND

Phase lock loop (hereinafter "PLL") circuits remain integral to the functionality of modern signal processing technologies. Specifically, these circuits provide effective means for isolation and purification of desired signals in high noise environments and can be implemented in a variety of technological applications, including signal demodulation, signal recovery, and clock timing synchronization.

But while PLL circuitry may be versatile in its application, current implementations suffer from extensive drawbacks. For one, existing PLL circuits must strike a compromise between precision and accuracy. Particularly in high noise environments, there remains a potential risk that a PLL circuit will phase lock on to an undesired signal, which can lead to inaccurate measurements. Even when a PLL circuit initially locks on to a desired signal, a second problem occurs when the circuit erroneously switches to a tempting yet ultimately deceiving sideband noise signal. These problems become more apparent when a PLL circuit indiscriminately locks on to the largest signal in its signal path. Without further guidance, PLL circuits remain at the mercy of the signal environments they analyze.

Existing PLL circuits attempt to remedy the above-mentioned problems through gain control of the PLL circuit. By reducing the gain, the search path of the circuit is reduced, thereby reducing the risk that the circuit will lock on to an undesirable signal. In doing so, however, accuracy of the circuit is preserved at the cost of precision. Gain reduction results in a reduction of the frequency response, which ultimately means the PLL circuit cannot track rapidly changing signals. In a fast-moving system, this trade off can be fatally flawed.

Accordingly, there remains a need for a PLL circuit that can precisely and accurately detect, and phase lock, on to desired signals while maintaining a high bandwidth and frequency response.

SUMMARY

In one embodiment, a system is provided. The system comprises a gyroscope, wherein the gyroscope is configured to produce a beat note signal having a first frequency and a first phase, and a phase lock loop circuit coupled to the gyroscope. The phase lock loop circuit comprises a node, coupled to the gyroscope and configured to receive the beat note signal, and a control circuit, wherein the control circuit is configured to input an estimation having a second frequency and a second phase, wherein the second frequency is selected from a range of frequencies including the first frequency. The phase lock loop circuit further comprises a numerically controlled oscillator coupled to the control circuit, wherein the control circuit is configured to control an output response of the numerically controlled oscillator. The numerically controlled oscillator is configured to: receive the estimation from the control circuit and generate an output signal in response to the estimation. The phase lock loop circuit further comprises a phase detector coupled to the control circuit, the numerically controlled oscillator, and the gyroscope, wherein the phase detector is configured to compare the beat note signal and the output signal and produce a comparison output, the comparison output indicative of a phase difference between the beat note signal and the estimation.

In another embodiment, a phase lock loop circuit is provided. The phase lock loop circuit, comprises a node configured to receive a first signal having a first frequency and a first phase; a control circuit, wherein the control circuit is configured to input an estimation having a second frequency and a second phase, wherein the second frequency is selected from a range of frequencies including the first frequency. The phase lock loop circuit further comprises a numerically controlled oscillator coupled to the control circuit, wherein the control circuit is configured to control an output response of the numerically controlled oscillator. The numerically controlled oscillator is configured to receive the estimation from the control circuit and generate an output signal in response to the estimation. The phase lock loop circuit further comprises a phase detector coupled to the control circuit and the numerically controlled oscillator, wherein the phase detector is configured to compare the first signal and the output signal and produce a comparison output, the comparison output indicative of a phase difference between the first signal and the estimation.

In another embodiment, a method is provided. The method comprises receiving a first signal having a first frequency; mixing the first signal with a frequency estimation, wherein the frequency estimation is selected from a range of frequencies including the first frequency; and comparing the first signal and the frequency estimation to determine an error value. If the error value is zero, then the method further comprises providing a frequency calculation output in response to the error value.

BRIEF DESCRIPTION OF THE DRAWINGS

Exemplary features of the present disclosure, its nature and various advantages will be apparent from the accompanying drawings and the following detailed description of various embodiments. Non-limiting and non-exhaustive embodiments are described with reference to the accompanying drawings, wherein like labels or reference numbers refer to like parts throughout the various views unless otherwise specified. The sizes and relative positions of elements in the drawings are not necessarily drawn to scale. One or more embodiments are described hereinafter with reference to the accompanying drawings in which.

DETAILED DESCRIPTION

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is accordingly understood that other embodiments may be utilized and that logical, mechanical, and electrical changes may be made without departing from the scope of the present invention. The following detailed description is, therefore, not to be taken in a limiting sense.

Embodiments of the present disclosure describe systems and methods relating to a PLL circuit that can phase lock on to a desired signal based on system knowledge feedback. Specifically, the present disclosure describes circuitry for inputting an estimation signal to the main feedback loop for comparison to a received first signal having a first frequency and a first phase. The estimation signal has a second frequency and a second phase, wherein the second frequency is selected based on a range of frequencies, the range of frequencies being determined corresponding to the characteristics of the received first signal. The PLL circuit can then compare the phase response of the two signals and generate an output signal. In the different embodiments discussed herein, the output signal (which, in some embodiments, may correspond to a rate of change calculation) can be generated in different fashions and can be modified based on the circuitry used to input signals to the main feedback loop.

Figure 1:
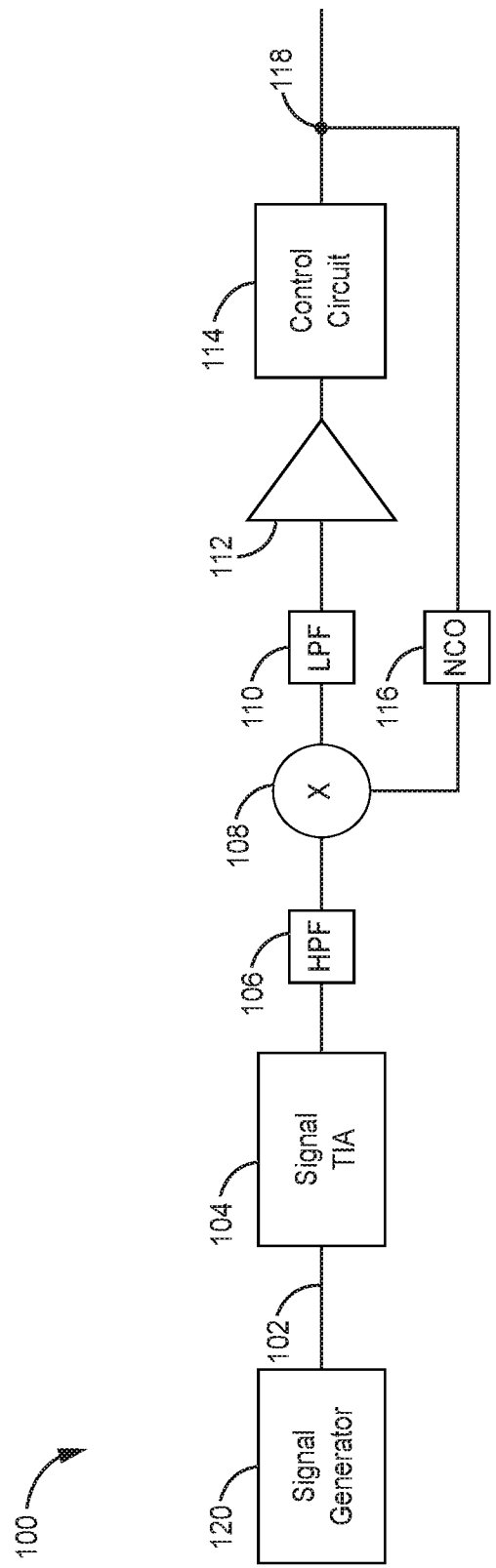
FIG. 1 is a block diagram of one embodiment of a system with a PLL circuit that includes a control circuit for feeding an estimation signal for phase comparison according to the teachings of the present disclosure.

An example embodiment of a PLL circuit with circuitry used to input comparison signals is shown in FIG. 1. The PLL circuit is shown generally at 100, and may be embodied as a standalone circuit, or may be coupled to various other systems or devices. One exemplary embodiment includes a gyroscope (indicated more generally at signal generator 120) coupled to PLL circuit 100, wherein a first signal received at 102 is generated via the output of the gyroscope and sent through PLL circuit 100 for further signal processing. U.S. Patent Application No. 2016/0334217 describes an example of such a gyroscope, and the contents of U.S. Patent Application No. 2016/0334217 are hereby incorporated by reference in its entirety.

PLL circuit 100 operates by using circuitry to provide a guided estimation of a desired target signal to phase lock and to limit the search range of PLL circuit 100 only to relevant search frequencies, thereby preventing accidental phase lock to an undesired noise signal. Node 102 receives a first signal with a corresponding frequency and phase from signal generator 120. Signal generator 120 may include any circuit or device configured to produce an electrical or optical signal with a corresponding frequency. While a gyroscope is illustrated for pedagogical reasons, one skilled in the art will recognize that the same principles apply to any system or device for which phase locking onto a target frequency is desirable.

The first signal received by node 102 represents a desired target signal suitable for phase lock from signal generator 120 that is input into PLL circuit 100, which as described in further detail below, is also used to determine a frequency range of input signals that is generated by the control circuit 114. By way of example, and not by way of limitation, in the case where signal generator 120 comprises a resonance fiber optic gyroscope (hereinafter "RFOG"), the signal received at node 102 represents a function of rate measured by the RFOG, otherwise known as a beat note signal.

Still referring to FIG. 1, control circuit 114 is a circuit that is coupled to the feedback loop of the PLL circuit 100, usually directly or indirectly to numerically controlled oscillator (NCO) 116. Control circuit 114 can be any suitable type, or suitable combination, of a software-configurable, firmware-configurable, or hard-wired control circuit, including a microprocessor, microcontroller, field-programmable gate array (hereinafter "FPGA"), and an application-specific integrated circuit (hereinafter "ASIC") in an analog implementation.

The estimation signal that is transmitted by control circuit 114 has a frequency determined by a specified frequency range that contains the desired target frequency. The range of frequencies is dependent on the characteristics of the signal received at node 102. That is, the range of frequencies should be calculated such that the desired target signal, whose precise frequency is still unknown but estimated by the signal received by control circuit 114, is included within the range of the frequency search interval received by control circuit 114. The estimation can be made through any independent means that are observable to the control circuit 114 or user, such as via an RFOG rate estimate or spectrum analyzer (not shown). The range of frequencies should also be calculated to avoid any known sideband noise signals that lie in close frequency proximity to the desired target signal, in particular any sideband noise signals that cause a significant risk of erroneous phase locking by PLL 100. Such signals can be identified, for example, by the magnitude (e.g. strength) of the signal in relation to the desired target signal. In doing so, control circuit 114 can transmit a signal to the feedback loop that avoids phase locking to a false positive signal. In an exemplary embodiment wherein PLL circuit 100 is coupled to an RFOG, the range of frequencies can be determined by the following equation:

$$\text{Frequency Range} = [f_L, f_H] = \left[ f_0 - \frac{f_d}{2}, f_0 + \frac{f_d}{2} \right] \quad \text{Equation 1}$$

where $f_L$ is the lowest search frequency, $f_H$ is the highest search frequency, $f_0$ is the measured Free Spectral Range (FSR) of the interference pattern produced by the RFOG (which can be measured by an independent system within the RFOG) and an estimate of the beat note frequency $BN_e$, and $f_d$ is the separation frequency, which is the difference between two known modulation frequencies (Modulation 1 and Modulation 2) applied to the counter-propagating waves input into the gyroscope, which generate the known sideband noise signals that lie in close frequency proximity to the desired target signal. An example embodiment of control circuit 114 and the creation of $f_L$ and $f_H$ using $BN_e$, Modulation 1, and Modulation 2 is further described in FIG. 2. Reset signal 216 can be generated when powering up the RFOG and can be set to 0 during reset and 1 when not in reset. One skilled in the art will recognize that Equation 1 can be further modified based on a non-gyroscopic system.

Figure 2:
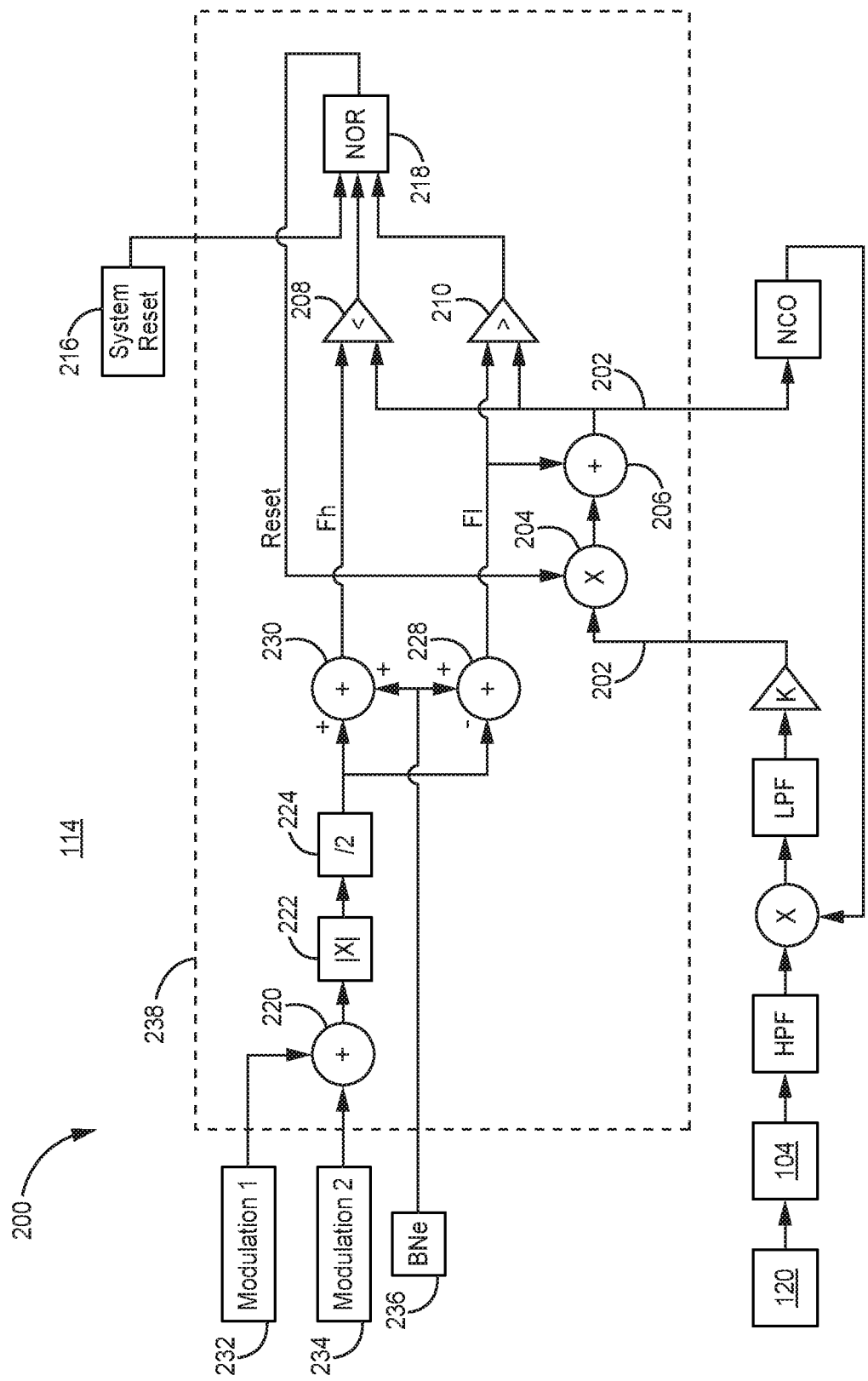
FIG. 2 is a block diagram of another embodiment of a system with a PLL circuit that includes another embodiment of a control circuit according to the teachings of the present disclosure.
Figure 3:
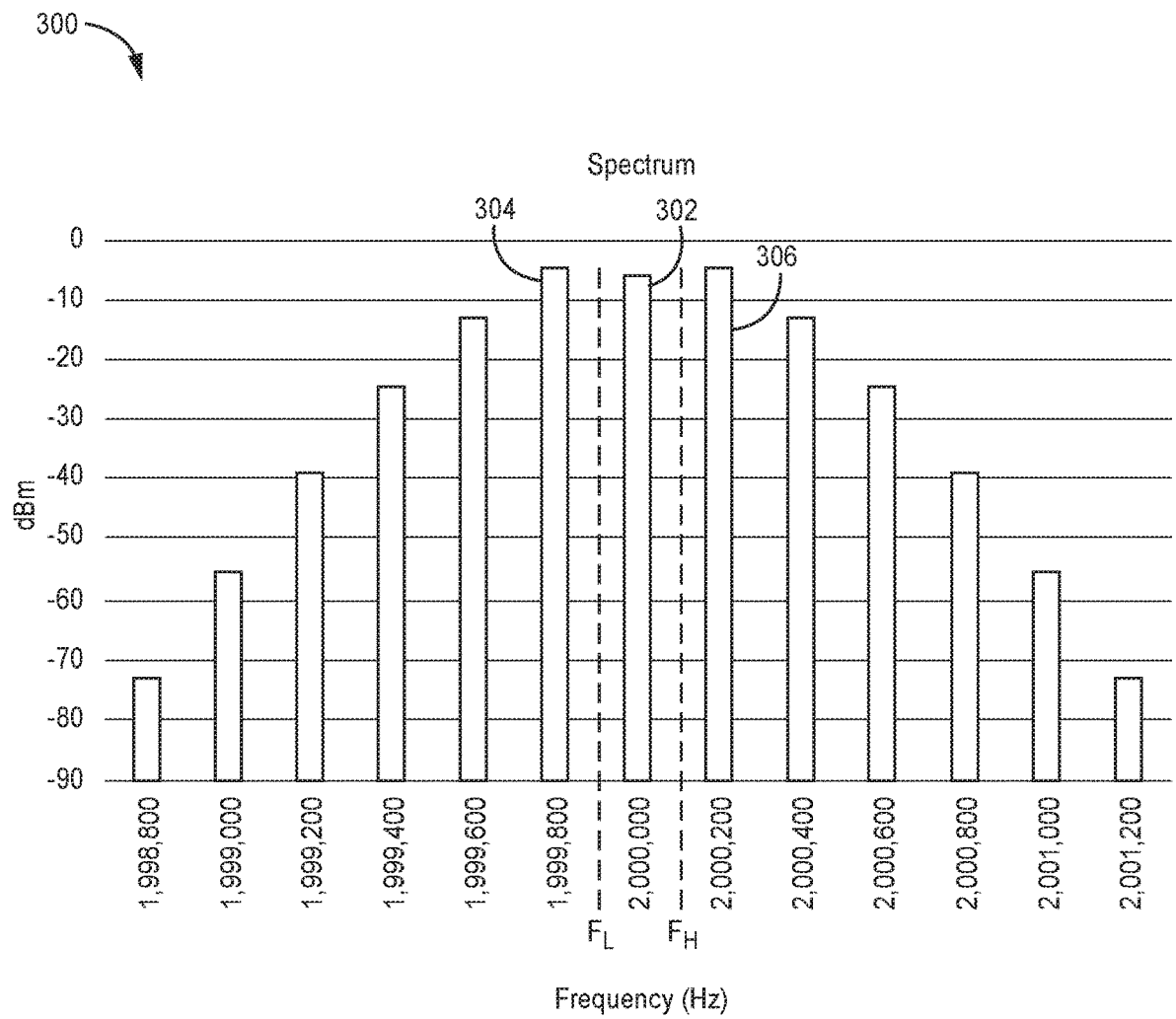
FIG. 3 is a graphical illustration of a signal spectrum that may be subject to phase lock by embodiments of a PLL circuit according to the teachings of the present disclosure.

FIG. 3 illustrates the importance of setting a suitable range of frequencies for control circuit 114. Plot 300 depicts a frequency spectrum for a set of acquired signals. The frequencies of each signal (shown in Hz) are plotted against their respective signal strength (shown in dBm). Each signal in plot 300 represents a potential component of the received signal at node 102 of PLL circuit 100. The distance between sidebands is dependent on the difference between the modulation frequencies (e.g. Modulation 1 and Modulation 2 of FIG. 2 described below). In the exemplary illustration shown in FIG. 3, the difference between Modulation 1 and Modulation 2 is 200 Hz. Therefore, the sidebands are spaced 200 Hz apart. Signal 302 represents the desired target signal to which PLL circuit 100 ideally would phase lock, while signals 304 and 306 represent nearby sideband noise signals. Although plot 200 illustrates a frequency spectrum from 1.9988-2.0012 MHz, one skilled in the art will recognize that the same principles described herein apply both to different frequencies and frequency spectra.

As shown in plot 300, the strength of signal 304 is greater than the strength of signal 302. Existing PLL circuits may indiscriminately phase lock on to the signal that has the largest signal strength. This approach may produce two problems. First, a PLL circuit that receives a strong sideband signal 304 within its frequency search range may erroneously lock on to sideband signal 304 (or sideband signal 306) instead of desired target signal 302. Second, a PLL circuit that has correctly locked on to desired target signal 302 may nonetheless erroneously switch and lock on to sideband signal 304 (or sideband signal 306). While existing PLL circuits may reduce the gain of the feedback loop to prevent phase locking on to signals 304 and 306, the frequency response of such PLL circuit is also reduced.

The embodiments disclosed herein can reduce the likelihood of erroneous phase locking on to sideband signals 304 and 306 while maintaining the frequency response of the PLL circuit. Specifically, by implementing circuitry (for example, control circuit 114) that can define a range of frequencies to guide the search path of the PLL circuit, the PLL circuit can discriminately lock on to a desired target signal 302 without subsequently switching to sideband signals 304 or 306. For example, referring to FIG. 3, the range of frequencies can be set to lock on to desired target signal 302 such that the minimum value could be 1.9999 MHz and the maximum value could be 2.0001 MHz. As the PLL circuit attempts to phase lock to desired target signal 302, control circuit 114 sets the minimum frequency to 1.9999 MHz and a voltage or numerically controlled oscillator circuit (such as NCO 116) begins at 1.9999 MHz and increases the NCO output frequency until it reaches the frequency of desired target signal 302 (measured at 2 MHz in FIG. 3) that is sent by signal generator 120.

But in the event that an error occurs and the PLL circuit does not lock onto desired target signal 302, NCO 116 continues to output increased frequencies beyond the frequency of desired target signal 302 until the frequency output of NCO 116 reaches the highest search frequency in the defined range of frequencies (shown as frequency 2.0001 MHz in FIG. 3). At that point, control circuit 114 is configured to restart the output frequency of NCO 116 to the lowest search frequency in the defined range of frequencies and repeat the search. Control circuit 114 can be configured to input estimation frequencies discretely (e.g. in set frequency intervals within the range of frequencies), or continuously sweep through the range of frequencies until the desired target frequency is selected. By resetting the output frequency of NCO 116 to the lowest search frequency in the defined range of frequencies, PLL circuit 100 can potentially phase lock onto desired target signal 302 without the risk of phase locking onto sideband signals 304 and 306.

Referring back to FIG. 1, control circuit 114 selects a frequency within the range of frequencies and generates an estimation that is transmitted to numerically controlled oscillator 116. Numerically controlled oscillator 116 receives the estimation, which can be implemented as a Frequency Tuning Word (hereinafter "FTW"), and creates a synchronous, discreet waveform with the frequency represented by the FTW. In one embodiment, the numerically controlled oscillator 116 comprises a direct digital synthesizer, which converts the discreet FTW of the initial input signal into an analog signal with the frequency represented by the FTW. One input of the phase detector 108 is configured to receive the estimation signal transmitted by the numerically controlled oscillator 116.

Meanwhile, the signal received at node 102 is optionally sent through signal transimpedance amplifier 104 and high-pass filter (HPF) 106 and enters the second input of the phase detector 108. Phase detector 108 is configured to compare the two signals and generate a comparison output indicative of a phase difference, or error, between the two signals. Essentially, the comparison output generated by phase detector 108 represents an error signal based on the phase difference between the signal received at node 102 from signal generator 120 and the estimation signal. If the error signal equals zero, then the two signals match both frequency and phase. If the error signal does not equal zero, then the two signals have a corresponding phase difference. However, the two signals may still have the same frequency, if the phase difference between them remains constant over time. In that case the error signal value would correspond to a constant phase shift. As described in more detail below, PLL circuit 100 is configured to adjust the signal generated by NCO 116 until the error signal generated by phase detector 108 is minimized over time, thus determining the desired target signal to phase lock.

Phase detector 108 can include many different circuit elements, including a comparator circuit, a mixer, or a multiplier, or an analogous circuit element, or a digital equivalent thereof known in the art. In the case where phase detector 108 is a multiplier, numerically controlled oscillator 116 is configured to modulate the estimation signal either 90 or 270 degrees prior to entering the first input of phase detector 108, in order to eliminate excess amplitude to the error signal as a result of the added phase component to the signal multiplication product. Without such modulation, a phase detector 108 embodied as a multiplier could still generate an error response even if the two signals were identical in phase and frequency, and could generate a reduced error response for signals that were in quadrature.

The error signal is sent to low-pass filter (LPF) 110, which filters out high frequency components. Those skilled in the art will appreciate that many characteristics of the PLL circuit are dependent on the quality of low-pass filter 110, such as the purity of the error signal, loop stability, and the bandwidth. For example, in an embodiment, the error signal generated from phase detector 108 represents not only the difference in frequencies between the frequency generated by signal generator 120 and the frequency inputted by control circuit 114 (which is desired) but also the sum of the two frequencies (which is not desired). LPF 110 is configured to filter out the sum of the two frequencies, thus passing only the frequency difference through the feedback loop.

After passing through low-pass filter 110, the signal optionally reaches amplifier 112. Amplifier 112 may be used to set an appropriate gain level to PLL circuit 100. Because the feedback loop search frequency range is determined based on control circuit 114, modifying the gain via amplifier 112 results in less of a detriment to the frequency response of PLL circuit 100. Thus, the gain should be modified in order to produce a desired bandwidth range and frequency response.

Numerically controlled oscillator 116 receives the filtered and amplified signal and subsequently generates an output signal 118 based on the FTW. The output signal 118 corresponds to a phase difference between the compared signals and can take many forms and meanings. For example, when signal generator 120 includes an RFOG, output signal 118 may represent a value used for rate calculation. In another embodiment, numerically controlled oscillator 116 comprises a direct digital synthesizer, which integrates the FTW over a set period of time and produces an accumulated signal output. The accumulated signal output could be a sine wave with a frequency equivalent to the signal produced by signal generator 120 that is also phase locked at that signal. Because phase detector 108 produces an error signal that may be nonzero even for two signals that share the same frequency, an accumulated signal output would be advantageous in determining whether the compared signals are merely shifted in phase or have different frequencies entirely. In another embodiment, control circuit 114 further comprises a summer, which sums the accumulated signal output and the estimation from control circuit 114. In that case, phase calculation output 118 would be the value of the desired target signal and the value of the phase increment generated by the feedback loop. Phase calculation output 118 can be further processed as needed based on the needs of the particular system.

Numerically controlled oscillator 116 is further configured to transmit the generated output signal back into the feedback loop of PLL circuit 100. The signal transmitted by control circuit 114 is used as a reference signal to adjust the output of numerically controlled oscillator 116. In one embodiment, control circuit 114 transmits a FTW, which is within the range of frequencies generated by control circuit 114, to numerically controlled oscillator 116. The FTW is then compared to the signal transmitted by signal generator 120 received at node 102 using phase detector 108. In another embodiment, numerically controlled oscillator 116 comprises a direct digital synthesizer, which is configured to integrate the FTW over a set period of time to create an accumulated signal output. As direct digital synthesizer 116 is integrating the FTW, the direct digital synthesizer is tuned such that the feedback loop signal transmitted by direct digital synthesizer 116 matches the frequency of the signal received at the second input of phase detector 108, which has the characteristics of the signal received at node 102. Once both signals have the same frequency, phase detector 108 generates a minimized error signal, at which point direct digital synthesizer 116 is configured to stop integrating the FTW and transmit the FTW for phase and optionally rate calculation.

Referring now to FIG. 2, an exemplary block diagram of another embodiment of a system with a PLL and an embodiment of another control circuit, indicated at 238 in place of control circuit 114 illustrated in FIG. 1. Control circuit 238 can include signal multiplier 204, summer 206, logic gate 218, and comparators 208 and 210. Signal multiplier 204 receives an incoming signal sent by bus 202, which connects control circuit 238 to the main feedback loop.

Modulation frequency generators 232 and 234 (referenced as Modulation 1 and Modulation 2 respectively) each transmit a signal of the known modulation frequencies. The two modulation frequencies are the frequencies that generate the known sideband signals that can cause erroneous phase locking. U.S. Pat. No. 9,115,994, titled "Systems and Methods Sideband Heterodyning Detection" describes examples of how such modulation frequency generators can be implemented, and the structure described in U.S. Pat. No. 9,115, 994 relating to frequency modulators is hereby incorporated in its entirety. The value of the frequency separation of the spurs can also be obtained by any means available to the user.

Modulation 1 and Modulation 2 are sent to summer 220 which is configured to calculate the difference between the two modulation frequency values. In block 222, the difference of the two modulation frequency values are transformed to reflect the absolute value of the difference of the two modulation frequency values; the resultant is then halved at block 224. Both blocks 222 and 224 include appropriate circuitry known in the art to accomplish these functions. The signal is split and combined with a signal transmitted by beat note signal generator 226 (referenced in FIG. 2 as BNe) at summers 228 and 230. BNe is the initial frequency estimate of input signal 120. It can be determined by an RFOG rate calculator or any such means available to the user. The output of summer 228 corresponds to a frequency difference between the beat note frequency initial estimate and half the separation frequency of the known spurs; this frequency difference is the low threshold value and is designated as $F_L$, which may correspond to the lowest frequency in the search range of frequencies ultimately input by control circuit 238 represented by Equation 1 and FIG. 2. Similarly, the output of summer 230 represents a summation of the beat note frequency initial estimate and half the separation frequency of the known spurs, which is designated as $F_H$ (the highest frequency in the search range) in Equation 1 and FIG. 2.

The output signal from the main feedback loop (such as the signal outputted by amplifier 112) is sent through signal multiplier 204 and combined with $F_L$ at summer 206. The resulting output is then fed to comparators 208 and 210 for comparison with the respective $F_L$ or $F_H$ threshold values. Comparator 208 is configured to determine if the signal from summer 206 is below the high threshold $F_H$. If not, comparator 208 causes NOR gate 218 to reset the estimate of the frequency to the low threshold value $F_L$ by passing a low logic value to multiplier 204. Likewise, comparator 210 is configured to compare the signal from summer 206 with the low threshold value, $F_L$. If the output of summer 206 is below the low threshold value $F_L$, then comparator 210 causes NOR gate 218 to reset the estimate of the frequency to the low threshold value $F_L$ by passing a low logic value to multiplier 204.

Although Modulation 1, Modulation 2, beat note signal generator 226, and reset signal generator 216 are depicted outside of control circuit 238, one skilled in the art will recognize that these components can be integrated into control circuit 238 itself.

Figure 4:
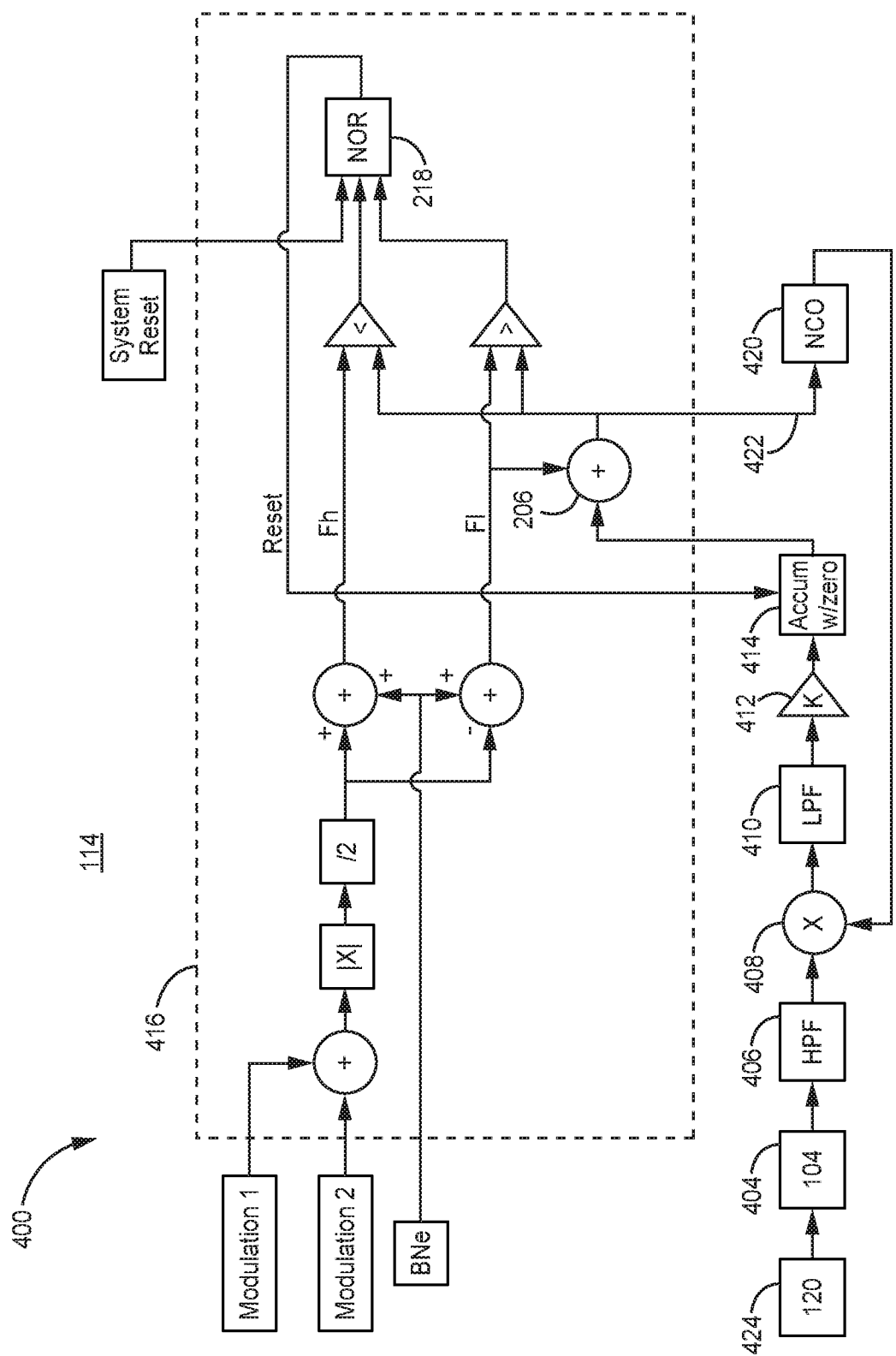
FIG. 4 is a block diagram of another embodiment of a PLL circuit that includes additional circuitry for generating an output signal according to the teachings of the present disclosure.

FIG. 4 is a block diagram of another embodiment of the present disclosure. PLL circuit 400 functions in a similar way to PLL circuit 100 with some exceptions. Like in FIG. 1, control circuit 416 selects an estimation signal having a frequency within a defined set of frequencies and transmits the estimation to the feedback loop. Because the feedback loop is in reset at the time control circuit 416 transmits the initial estimation, summer 206 receives a zero value from accumulator 414, and so the initial estimation ($F_L$) from control circuit 416 passes through summer 206 to numerically controlled oscillator 420. Numerically controlled oscillator 420 feeds the initial estimation to the first input of phase detector 408. When the reset is released and the loop is closed, a node receives a signal from signal generator 424 having a second frequency and phase, which may pass through signal transimpedance amplifier 404 and high-pass filter 406 to the second input of phase detector 408. Phase detector 408 generates an error signal as described above, which can be filtered through low-pass filter 410 and amplifier 412.

However, unlike PLL circuit 100, PLL circuit 400 further comprises an accumulator 414, separate from numerically controlled oscillator 420. Accumulator 414 is configured to perform similar functions to an integrator. In an embodiment, accumulator 414 is configured to accumulate the error signal to generate an accumulated signal output, which then may be summed with the estimation signal at control circuit 416 such as via summer 206, and transmitted for phase and optionally rate calculation. Control circuit 416 may be further configured to transmit a reset signal to accumulator 414 to reset the accumulation period, such as via the output of logic gate 218. The accumulated signal output is also used to adjust the output response of numerically controlled oscillator 420 as described above. In another embodiment, numerically controlled oscillator 420 comprises a direct digital synthesizer. In that case, both direct digital synthesizer 420 and accumulator 414 can accumulate the error signal. To stabilize PLL circuit 400, accumulator 414 includes a zero in the transfer function.

Figure 5:
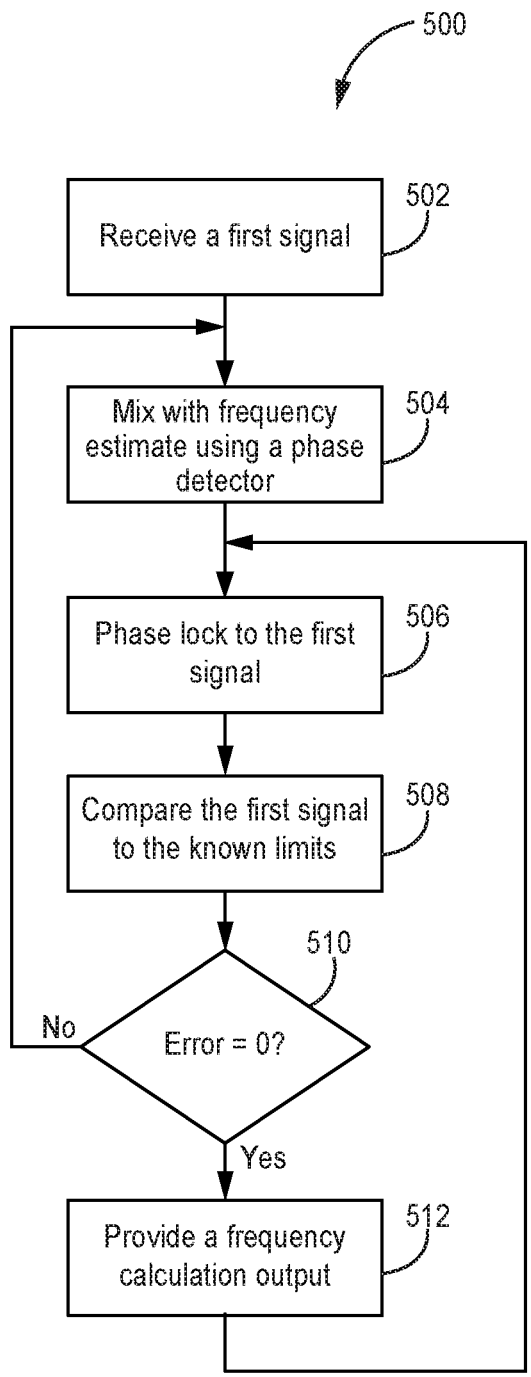
FIG. 5 is a flow chart of a process for phase locking on to a desired target signal according to the teachings of the present disclosure.

FIG. 5 is a flow chart illustrating a process 500 for phase locking on to a desired target signal while rejecting sideband signals that are in close frequency proximity to the desired signal. Process 500 may be realized through the techniques described above, but may be realized through other means as well. Additionally, FIG. 5 is intended to be illustrative of process 500 and not limiting. The process 500 begins at block 502, where a first signal (the desired signal) is received having a first frequency and a first phase. The first signal can be obtained from, for example, the beat note signal transmitted by an RFOG, but may be from any such entity for which phase locking onto the first signal would be desirable.

The process 500 proceeds to block 504, where the first signal is mixed with a frequency estimate using a phase detector. To reject the sideband signals associated with the first signal, the frequency estimate is selected to be within a specific range of the frequency of the desired, or first signal. In the RFOG example, the minimum and maximum values of the range of frequencies are the beat note frequency±a separation frequency, which is based on a frequency difference of the two frequencies of the counter-propagating waves in the RFOG. In other embodiments, the range is set to assure that the sideband signals are rejected by process 500.

The process 500 then proceeds to block 506 by phase locking on to the first signal. In the following step, shown at block 508, process 500 compares the first signal to the known limits, e.g., the upper and lower ends of the range of frequencies allowed for process 500 to look for the first signal. In some examples, the comparison is done by a multiplier, mixer, or other comparator circuit. If a multiplier is used, then the frequency estimation signal may be modulated 90 or 270 degrees. This comparison assures that the output of process 500 will be within the range of signals that fall between the anticipated sideband signals.

In decision block 510, process 500 determines whether a non-zero error is detected in block 504, for example a phase difference over a period of time. If the error value is nonzero, then process 500 proceeds back to block 504 with another frequency estimation in the defined range of frequencies. In this situation, process 500 may then be repeated using different frequency estimates until the desired target signal is acquired, and frequency lock is achieved. The error value may be generated using a variety of techniques, such as those generating the output signal in FIGS. 1, 2, and 4 shown above. For example, in an embodiment, the error value is accumulated over a period of time (such as via a numerically controlled oscillator or accumulator) to generate an accumulated error value.

If the error value is zero, then process 500 then proceeds to block 512, where a frequency calculation output is provided. In this situation, the frequency estimate represents the target signal that is suitable for phase lock. Thus, process 500 proceeds back to 506 by phase locking on to the correct frequency estimate. In some examples, the frequency calculation output can be used to determine a rate calculation. In other examples, the frequency calculation output is generated based on accumulating the phase difference over a set period of time to generate an accumulated signal output. In further examples, the accumulated signal output is summed with the frequency estimation.

EXAMPLE EMBODIMENTS

Example 1 includes a system, comprising: a gyroscope, wherein the gyroscope is configured to produce a beat note signal having a first frequency and a first phase; and a phase lock loop circuit coupled to the gyroscope, the phase lock loop circuit comprising: a node, coupled to the gyroscope and configured to receive the beat note signal; a control circuit, wherein the control circuit is configured to input an estimation having a second frequency and a second phase, wherein the second frequency is selected from a range of frequencies including the first frequency; a numerically controlled oscillator coupled to the control circuit, wherein the control circuit is configured to control an output response of the numerically controlled oscillator, wherein the numerically controlled oscillator is configured to: receive the estimation from the control circuit, and generate an output signal in response to the estimation; and a phase detector coupled to the control circuit, the numerically controlled oscillator, and the gyroscope, wherein the phase detector is configured to: compare the beat note signal and the output signal, and produce a comparison output, the comparison output indicative of a phase difference between the beat note signal and the estimation.

Example 2 includes the system of Example 1, wherein the range of frequencies is based on a separation frequency, the separation frequency determined by a frequency difference between the first frequency and an estimation frequency, wherein the estimation frequency is an acquired reference frequency corresponding to a frequency of interest.

Example 3 includes the system of any of Examples 1-2, wherein the phase lock loop circuit further comprises a signal accumulator coupled to the phase detector and the numerically controlled oscillator, wherein the signal accumulator is configured to accumulate the comparison output over a time period to generate an accumulated signal output.

Example 4 includes the system of Example 3, wherein the numerically controlled oscillator is further configured to: receive the accumulated signal output; and transmit an adjusted signal output to the phase detector in response to receiving the accumulated signal output.

Example 5 includes the system of any of Examples 3-4, wherein the control circuit is further configured to: transmit the estimation to the numerically controlled oscillator; receive the accumulated signal output; and sum the accumulated signal output with the estimation.

Example 6 includes the system of any of Examples 1-5, wherein the numerically controlled oscillator comprises a direct digital synthesizer.

Example 7 includes the system of any of Examples 1-6, wherein: the phase detector comprises a phase multiplier, and the second phase is modulated 90 or 270 degrees prior to the estimation entering the phase multiplier.

Example 8 includes a phase lock loop circuit, comprising: a node configured to receive a first signal having a first frequency and a first phase; a control circuit, wherein the control circuit is configured to input an estimation having a second frequency and a second phase, wherein the second frequency is selected from a range of frequencies including the first frequency; a numerically controlled oscillator coupled to the control circuit, wherein the control circuit is configured to control an output response of the numerically controlled oscillator, wherein the numerically controlled oscillator is configured to: receive the estimation from the control circuit, and generate an output signal in response to the estimation; and a phase detector coupled to the control circuit and the numerically controlled oscillator, wherein the phase detector is configured to: compare the first signal and the output signal, and produce a comparison output, the comparison output indicative of a phase difference between the first signal and the estimation.

Example 9 includes the phase lock loop circuit of Example 8, wherein the range of frequencies is based on a separation frequency, the separation frequency determined by a frequency difference between the first frequency and an estimation frequency, wherein the estimation frequency is an acquired reference frequency corresponding to a frequency of interest.

Example 10 includes the phase lock looping circuit of any of Examples 8-9, wherein the phase lock loop circuit further comprises a signal accumulator coupled to the phase detector and the numerically controlled oscillator, wherein the signal accumulator is configured to accumulate the comparison output over a time period to generate an accumulated signal output.

Example 11 includes the phase lock loop circuit of Example 10, wherein the numerically controlled oscillator is further configured to: receive the accumulated signal output; and transmit an adjusted signal output to the phase detector in response to receiving the accumulated signal output.

Example 12 includes the phase lock loop circuit of any of Examples 10-11, wherein the control circuit is further configured to: transmit the estimation to the numerically controlled oscillator; receive the accumulated signal output; and sum the accumulated signal output with the estimation.

Example 13 includes the phase lock loop circuit of any of Examples 8-12, wherein the numerically controlled oscillator comprises a direct digital synthesizer.

Example 14 includes the phase lock loop circuit of any of Examples 8-13, wherein: the phase detector comprises a phase multiplier, and the second phase is modulated 90 or 270 degrees prior to the estimation entering the phase multiplier.

Example 15 includes a method comprising: receiving a first signal having a first frequency; mixing the first signal with a frequency estimation, wherein the frequency estimation is selected from a range of frequencies including the first frequency; comparing the first signal and the frequency estimation to determine an error value; and if the error value is zero, then providing a frequency calculation output in response to the error value.

Example 16 includes the method of Example 15, wherein the range of frequencies is based on a separation frequency, the separation frequency determined by a frequency difference between the first frequency and an estimation frequency, wherein the estimation frequency is an acquired reference frequency corresponding to a frequency of interest.

Example 17 includes the method of any of Examples 15-16, wherein comparing the first signal and the frequency estimation further comprises accumulating the error value over a time period.

Example 18 includes the method of any of Examples 15-17, wherein mixing the first signal and the frequency estimate further comprises mixing via a phase detector.

Example 19 includes the method of any of Examples 15-18, wherein providing a frequency calculation output further comprises generating a rate calculation output based on the frequency calculation output.

Example 20 includes the method of any of Examples 15-19, further comprising mixing the first signal with a second frequency estimation if the error value is nonzero, wherein the second frequency estimation is selected from the range of frequencies.

From the foregoing, it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated. Moreover, the circuit components described above may be disposed on a single or multiple integrated circuit (IC), one or more microprocessors, or one or more microcontrollers. In addition, one or more components of a described apparatus or system may have been omitted from the description for clarity or another reason. Furthermore, one or more components of a described apparatus or system that have been included in the description may be omitted from the apparatus or system.

What is claimed is:

1. A system, comprising:
   a gyroscope, wherein the gyroscope is configured to produce a beat note signal having a first frequency and a first phase; and
   a phase lock loop circuit coupled to the gyroscope, the phase lock loop circuit comprising:
   a node, coupled to the gyroscope and configured to receive the beat note signal;
   a control circuit, wherein the control circuit is configured to input an estimation having a second frequency and a second phase, wherein the second frequency is selected from a range of frequencies including the first frequency, wherein the range of frequencies is selected so as to exclude sideband signals closest in frequency proximity to the beat note signal;
   a numerically controlled oscillator coupled to the control circuit, wherein the control circuit is configured to control an output response of the numerically controlled oscillator, wherein the numerically controlled oscillator is configured to:
   receive the estimation from the control circuit, and generate an output signal in response to the estimation; and
   a phase detector coupled to the control circuit, the numerically controlled oscillator, and the node, wherein the phase detector is configured to:
   compare the beat note signal and the output signal, and produce a comparison output, the comparison output indicative of a phase difference between the beat note signal and the estimation.

2. The system of claim 1, wherein the range of frequencies is based on a separation frequency, the separation frequency determined by a frequency difference between the first frequency and an estimation frequency, wherein the estimation frequency is an acquired reference frequency corresponding to a frequency of interest.

3. The system of claim 1, wherein the phase lock loop circuit further comprises a signal accumulator coupled to the phase detector and the numerically controlled oscillator, wherein the signal accumulator is configured to accumulate the comparison output over a time period to generate an accumulated signal output.

4. The system of claim 3, wherein the numerically controlled oscillator is further configured to:
receive the accumulated signal output; and
transmit an adjusted signal output to the phase detector in response to receiving the accumulated signal output.

5. The system of claim 3, wherein the control circuit is further configured to: transmit the estimation to the numerically controlled oscillator;
receive the accumulated signal output; and
sum the accumulated signal output with the estimation.

6. The system of claim 1, wherein the numerically controlled oscillator comprises a direct digital synthesizer.

7. The system of claim 1, wherein:
the phase detector comprises a phase multiplier, and
the second phase is modulated 90 or 270 degrees prior to the estimation entering the phase multiplier.

8. A phase lock loop circuit, comprising:
a node configured to receive a first signal having a first frequency and a first phase;
a control circuit, wherein the control circuit is configured to input an estimation having a second frequency and a second phase, wherein the second frequency is selected from a range of frequencies including the first frequency, wherein the range of frequencies is selected so as to exclude sideband signals closest in frequency proximity to the first signal;
a numerically controlled oscillator coupled to the control circuit, wherein the control circuit is configured to control an output response of the numerically controlled oscillator, wherein the numerically controlled oscillator is configured to:
receive the estimation from the control circuit, and generate an output signal in response to the estimation; and
a phase detector coupled to the control circuit and the numerically controlled oscillator, wherein the phase detector is configured to:
compare the first signal and the output signal, and
produce a comparison output, the comparison output indicative of a phase difference between the first signal and the estimation.

9. The phase lock loop circuit of claim 8, wherein the range of frequencies is based on a separation frequency, the separation frequency determined by a frequency difference between the first frequency and an estimation frequency, wherein the estimation frequency is an acquired reference frequency corresponding to a frequency of interest.

10. The phase lock loop circuit of claim 8, wherein the phase lock loop circuit further comprises a signal accumulator coupled to the phase detector and the numerically controlled oscillator, wherein the signal accumulator is configured to accumulate the comparison output over a time period to generate an accumulated signal output.

11. The phase lock loop circuit of claim 10, wherein the numerically controlled oscillator is further configured to:
receive the accumulated signal output; and
transmit an adjusted signal output to the phase detector in response to receiving the accumulated signal output.

12. The phase lock loop circuit of claim 10, wherein the control circuit is further configured to:
transmit the estimation to the numerically controlled oscillator;
receive the accumulated signal output; and
sum the accumulated signal output with the estimation.

13. The phase lock loop circuit of claim 8, wherein the numerically controlled oscillator comprises a direct digital synthesizer.

14. The phase lock loop circuit of claim 8, wherein:
the phase detector comprises a phase multiplier, and
the second phase is modulated 90 or 270 degrees prior to the estimation entering the phase multiplier.

15. The phase lock loop circuit of claim 8, wherein the estimation corresponds to a value generated from an independent source corresponding to the first signal.

16. A method comprising:
receiving a first signal having a first frequency;
mixing the first signal with a frequency estimation, wherein the frequency estimation is selected from a range of frequencies including the first frequency, wherein the range of frequencies is selected so as to exclude sideband signals closest in frequency proximity to the first signal;
comparing the first signal and the frequency estimation to determine an error value; and
if the error value is zero, then providing a frequency calculation output in response to the error value.

17. The method of claim 16, wherein the range of frequencies is based on a separation frequency, the separation frequency determined by a frequency difference between the first frequency and an estimation frequency, wherein the estimation frequency is an acquired reference frequency corresponding to a frequency of interest.

18. The method of claim 16, wherein comparing the first signal and the frequency estimation further comprises accumulating the error value over a time period.

19. The method of claim 16, wherein mixing the first signal and the frequency estimation further comprises mixing via a phase detector.

20. The method of claim 16, wherein providing the frequency calculation output further comprises generating a rate calculation output based on the frequency calculation output.

21. The method of claim 16, further comprising mixing the first signal with a second frequency estimation if the error value is nonzero, wherein the second frequency estimation is selected from the range of frequencies.

* * * * *